United States Patent
Sakayori et al.

(10) Patent No.: US 8,066,891 B2
(45) Date of Patent: Nov. 29, 2011

(54) WET ETCHABLE LAMINATED BODY, INSULATION FILM, AND ELECTRONIC CIRCUIT PART USING THE LAMINATED BODY AND THE FILM

(75) Inventors: Katsuya Sakayori, Tokyo-To (JP); Terutoshi Momose, Tokyo-To (JP); Tomoko Togashi, Tokyo-To (JP); Shigeki Kawano, Tokyo-To (JP); Michiaki Uchiyama, Tokyo-To (JP); Kazuto Okamura, Kisarazu (JP); Kazutoshi Taguchi, Kisarazu (JP); Kazunori Ohmizo, Kisarazu (JP); Makoto Shimose, Kisarazu (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 139 days.

(21) Appl. No.: 11/543,812

(22) Filed: Oct. 6, 2006

(65) Prior Publication Data

US 2007/0026678 A1 Feb. 1, 2007

Related U.S. Application Data

(62) Division of application No. 10/468,115, filed as application No. PCT/JP02/01381 on Feb. 18, 2002, now abandoned.

(30) Foreign Application Priority Data

Feb. 16, 2001 (JP) .................................. 2001-040890

(51) Int. Cl.
 *H01B 13/00* (2006.01)
(52) U.S. Cl. ................. 216/13; 216/20; 216/33; 216/43; 438/214; 438/215; 438/332; 438/458; 156/330.9; 156/331.5

(58) Field of Classification Search .................... 216/13, 216/20, 33, 43; 428/215; 156/330.9, 331.5; 438/214, 215, 332, 458, 473.5
See application file for complete search history.

(56) References Cited

U.S. PATENT DOCUMENTS

| 4,543,295 A * | 9/1985 | St. Clair et al. ............... 428/458 |
| 5,300,364 A | 4/1994 | Hase et al. |
| 5,376,248 A * | 12/1994 | Conrod et al. ................ 205/164 |
| 5,621,068 A | 4/1997 | Okamoto et al. |
| 6,340,518 B1 * | 1/2002 | Kitahara et al. .............. 428/215 |
| 6,379,784 B1 * | 4/2002 | Yamamoto et al. ........... 428/216 |
| 6,548,153 B2 | 4/2003 | Kataoka et al. |
| 6,699,572 B2 | 3/2004 | Yamamoto et al. |

(Continued)

FOREIGN PATENT DOCUMENTS

JP 04-043029 2/1992

(Continued)

*Primary Examiner* — Lan Vinh
*Assistant Examiner* — Maki A Angadi
(74) *Attorney, Agent, or Firm* — Oliff & Berridge PLC (57) ABSTRACT

The present invention provides a laminate comprising an insulating layer having suppressed dusting properties, an insulating film comprising the insulating layer, and an electronic circuit component comprising a pattern of the insulating layer. The laminate has a layer construction of first inorganic material layer-insulating layer-second inorganic material layer or a layer construction of inorganic material layer-insulating layer. The insulating layer comprises a laminate of two or more wet etchable insulating unit layers. At the interface between the inorganic material layer and the insulating layer, surface irregularities of the inorganic material layer have been transferred onto the surface of the insulating layer. The average height of the surface irregularities transferred onto the insulating layer is less than the thickness of the outermost insulating unit layer in the insulating layer.

17 Claims, 7 Drawing Sheets

U.S. PATENT DOCUMENTS

| | | | |
|---|---|---|---|
| 2001/0010860 A1 | 8/2001 | Yamaguchi et al. | |
| 2004/0096676 A1 | 5/2004 | Sakayori et al. | |

FOREIGN PATENT DOCUMENTS

| | | |
|---|---|---|
| JP | 05-013902 | 1/1993 |
| JP | A-5-267810 | 10/1993 |
| JP | A-6-326158 | 11/1994 |
| JP | A-10-75053 | 3/1998 |
| JP | A-2000-13024 | 1/2000 |
| JP | 2000-71387 | 3/2000 |
| JP | 2000-190420 | 7/2000 |
| JP | A-2000-195032 | 7/2000 |

* cited by examiner

WET ETCHABLE LAMINATED BODY, INSULATION FILM, AND ELECTRONIC CIRCUIT PART USING THE LAMINATED BODY AND THE FILM

This application is a Divisional of application Ser. No. 10/468,115, filed Aug. 15, 2003 which is a National Phase of PCT/JP02/01381, filed Feb. 18, 2002 now abandoned. This application claims the benefit of Japanese Patent Application No. 2001-40890, filed Feb. 16, 2001. The entire disclosure of the prior applications is hereby incorporated by reference in its entirety.

TECHNICAL FIELD

The present invention relates to a laminate which has a layer construction of first inorganic material layer (mainly metal layer)-insulating layer-second inorganic material layer (mainly metal layer) or a layer construction of inorganic material layer (mainly metal layer)-insulating layer and has high suitability for wet etching of a plurality of resin layers constituting the insulating layer in the laminate. The present invention also relates to an insulating film and an electronic circuit component, for example, a wiring board such as a flexible printed board, a semiconductor related component such as CPS, a device such as a nozzle of a toner jet printer, particularly a suspension for a hard disk drive, produced by wet etching the laminate.

BACKGROUND OF THE INVENTION

In recent years, rapid development of semiconductor technology has led to rapid progress of a reduction in size of semiconductor packages, the adoption of multipin, the adoption of fine pitch, the minimization of electronic components and the like. That is, the semiconductor field has entered the so-called "age of high density packaging." This tendency has affected printed wiring boards, and the shifting of the wiring of the printed wiring boards from single side wiring to double side wiring, and, in addition, the adoption of a multilayer structure and a thickness reduction have been advanced (Iwata and Harazono, "Denshi Zairyo (Electronic Material)," 35 (10), 53 (1996)).

Pattern formation methods used in the formation of such wiring and circuits include: a method which comprises etching a metal layer, provided on a substrate in a layer construction of metal layer-insulating layer-metal layer, with an acidic solution, such as a ferric chloride solution, to form wirings, then subjecting the insulating layer to dry etching such as plasma etching or laser etching, or wet etching such as etching with hydrazine, to remove the insulating layer to form a desired shape for layer-to-layer continuity purposes (Japanese Patent Laid-Open No. 164084/1994), and connecting the wirings to each other, for example, through plating or electrically conductive paste; and a method (Proceedings of the 7th Symposium of Japan Institute of Electronics Packaging, issued in 1999) which comprises providing an insulating layer in a desired form using a photosensitive polyimide (Japanese Patent Laid-Open No. 168441/1992) or the like and then plating gaps to form wiring.

A tendency toward downsizing of electric products in recent years has led to a reduction in thickness of each layer constituting metal layer-polymeric insulator layer, and these layers each are in many cases used in a thickness of not more than 100 μm. When wiring has been formed of such thin layer, a warpage disadvantageously takes place in wiring due to a difference in coefficient of thermal expansion between the metal layer and the polymeric insulator layer.

When the thermal properties of the insulating layer and the conductor layer are known, the warpage σ of this substrate can be calculated according to the following equation (Miyaaki and Miki, NITTO TECHNICAL REPORT, 35 (3), 1 (1997)).

$$\sigma = \frac{3lE_1 E_2}{2h(E_1^2 + 14 E_1 E_2^2 + E_2^2)} \Delta\alpha \Delta T$$

wherein
 $E_1$: modulus of the metal,
 $E_2$: modulus of the insulating layer,
 $\Delta\alpha$: difference in coefficient of thermal expansion between the metal and the insulating layer,
 $\Delta T$: temperature difference,
 h: layer thickness, and
 l: wiring length.

According to this equation, (1) a method wherein the modulus of the insulating layer is reduced, and (2) a method wherein the difference in coefficient of thermal expansion between the insulating layer and the metal wiring layer is reduced, are considered effective for reducing the warpage of wiring.

Regarding the wiring formation method, in the laminate used in the method for the formation of wiring through etching of a metal layer in the laminate having layer construction of first metal layer-insulating layer-second metal layer, in order to reduce the warpage of the laminate, the coefficient of thermal expansion of the metal layer should be made identical to that of the insulating layer. To meet this requirement, the use of a low-expansion polyimide as the insulating layer of the laminate has been proposed (U.S. Pat. No. 4,543,295 and Japanese Patent Laid-Open Nos. 18426/1980 and 25267/1977).

Since, however, the low-expansion polyimide is not generally thermoplastic, the adhesion to metal layers is so low that it is difficult to provide adhesive strength high enough to withstand practical use. A known method for overcoming this problem is to use a thermoplastic polyimide resin or epoxy resin having good adhesion to the metal layer as an adhesive insulating layer between the metal layer and the insulating layer (core layer) of the low-expansion polyimide (Japanese Patent Laid-Open No. 58428/1995).

Since the thermoplastic resin generally has a high coefficient of thermal expansion, the lamination onto a metal is causative of the warpage. To overcome this drawback, the thickness of the low-expansion core insulating layer having a coefficient of thermal expansion close to that of the metal is made larger than the thickness of the adhesive layer to avoid the appearance of warpage of the whole laminate on the surface of the laminate. The smaller the thickness of the adhesive insulating layer, the better the warpage preventive effect. When the thickness of the adhesive insulating layer is excessively small, however, the adhesion is deteriorated. At least when the total thickness of the adhesive layers respectively overlying and underlying the core layer is not more than the half of the thickness of the core layer, the warpage is less likely to occur. For this reason, for commercially available laminates fabricated for electronic circuit components, in many cases, the total thickness of adhesive insulating layers is not more than the half of the thickness of the core insulating layer. The formation of the adhesive insulating layer in a smallest possible thickness, which can ensure the adhesion, is regarded as ideal (Japanese Patent Laid-Open No. 245587/1989).

At the present time, rapid expansion of production of personal computers has led to increased production of hard disk drives incorporated in the personal computers. A component, in the hard disk drive, called a "suspension," which supports a head for reading magnetism, is being shifted in its main products from one, wherein copper wiring is connected to a stainless steel plate spring, to one called a "wireless suspension" comprising copper wiring which has been connected directly to a stainless steel plate spring, from the viewpoint of coping with the size reduction.

The wireless suspension is mainly prepared using a laminate having a layer construction of first metal layer-adhesive insulating layer-core insulating layer-adhesive insulating layer-second metal layer. An example of the laminate is such that the first metal layer is formed of a copper alloy foil, the second metal layer is formed of a stainless steel foil, and the insulating layer is comprised of a core insulating layer and an adhesive insulating layer stacked on both sides of the core insulating layer. A wireless suspension using the laminate is scanned on a disk being rotated at a high speed and thus is a member to which fine vibration is applied. Therefore, the adhesive strength of wiring is very important. Accordingly, the wireless suspension using the laminate should satisfy strict specifications.

Hard disk drives are devices for recording information thereon. Therefore, a high level of data read/write reliability is required. To meet this requirement, the amount of refuse, such as dust, and outgas produced from the wireless suspension should be minimized.

A component called the "wireless suspension" is produced mainly by two methods, an additive method wherein wiring is formed by plating, and a subtractive method wherein wiring is formed by etching a copper foil. In the case of the subtractive method, only plasma etching by dry process is used for patterning of polyimide as the insulating layer.

A polyimide resin has been used as the adhesive for bonding between the insulating layer and the conductive inorganic material layer (metal layer) in the electronic circuit component, which satisfies the above strict specifications from the viewpoint of ensuring a high level of reliability of insulation. In order to impart adhesive properties to the polyimide resin, it is common practice to impart thermoplasticity. The introduction of a flexible structure, which can impart thermoplasticity, into a polyimide structure, however, in many cases enhances chemical resistance. Therefore, the polyimide resin, to which the adhesive properties have been imparted, is likely to have poor suitability for wet etching and is more difficult to be etched by wet process than the core insulating layer. For this reason, the insulating layers have been simultaneously etched by dry process using plasma or laser.

In the dry process, in general, sheet-by-sheet treatment is carried out. Therefore, the productivity is poor, and the apparatus is expensive. This disadvantageously leads to very high production cost. On the other hand, in the wet process, since a continuous object can be continuously etched, advantageously, the productivity is high and the apparatus cost is low. In wireless suspensions, however, the core insulating layer can be easily etched, while the adhesive insulating layer is difficult to be etched. Therefore, the adhesive insulating layer is left in a projected form (this phenomenon will be described later with reference to FIG. 9), and this poses a problem that a desired sharp etching shape cannot be provided and uneven etching occurs. The uneven etching is one of the causes of dusting during the use of wireless suspension. For this reason, in the laminate for wireless suspensions which should satisfy strict specifications, at the present time, the wet process cannot be put to practical use.

In the course of more detailed studies on the accuracy of the etching shape and the stability of the etched pattern in wet etching of the insulating layer, however, the present inventors have noticed that, in order to eliminate the above drawbacks, the conventional technique, that is, bringing the thickness of the adhesive insulating layer to the minimum layer thickness, which can keep the contemplated adhesion, is not an ideal one. The present inventors have found and aimed at the fact that, when the insulating layer in the laminate has been patterned by etching, irregularities (concaves and convexes) formed by the transfer of the shape of surface irregularities of the conductive inorganic material layer (metal layer) onto the adhesive insulating layer in the insulating layer affect the etching shape of the polyimide.

For example, a generally adopted process for producing electronic circuit components such as hard disk suspensions and flexible printed boards is as follows. An insulating layer is thermocompression bonded to and integrated with a conductive inorganic material (metal or the like) sheet to prepare a laminate. Alternatively, an insulating layer may be formed by coating on a conductive inorganic material (metal or the like) sheet to prepare a laminate. The laminate is then etched to produce the electronic circuit component. Various methods have been proposed for improving the interfacial adhesion of the laminate. Among them, a method, which is very effective and is generally used, is to utilize anchor effect. In this method, fine irregularities are formed on the surface of the conductive inorganic material layer. By virtue of the formation of the irregularities, at the time of compression bonding or coating, the insulating layer bites into the irregularities to develop the adhesion between the conductive inorganic material layer and the insulating layer. The transfer of irregularities of the conductive inorganic material layer onto the insulating layer can be confirmed by removing the conductive inorganic material layer in the laminate by etching or the like.

From the microscopic viewpoint, the formation of the irregularities in the insulating layer means that the thickness of the insulating layer varies from portion to portion. In the laminate used in the electronic circuit component, in general, the adhesive insulating layer formed on the surface of the insulating layer has in many cases a lower wet etching rate than the low-expansion core insulating layer. When the thickness of the adhesive insulating layer is identical to that of the core insulating layer, the time necessary for etching the adhesive insulating layer is in many cases longer than that necessary for etching the core insulating layer. In this case, when the thickness of the adhesive insulating layer is uneven, the shape of the end face of the adhesive insulating layer becomes complicated. As a result, the end face of the adhesive insulating layer is dropped, and this is causative of the occurrence of refuse. Further, after the adhesive insulating layer in its smaller thickness portion is removed, the core insulating layer only in its portion corresponding to the smaller thickness portion of the adhesive insulating layer is etched in an earlier stage than the other portion. As a result, the whole insulating layer cannot be evenly etched, and the etching shape is unstable.

When the thickness of the adhesive insulating layer is smaller than the average height of surface irregularities of the inorganic material layer in contact with the adhesive insulating layer, the irregularities of the inorganic material layer extend through some portions of the adhesive insulating layer and, consequently, disadvantageously, the adhesive insulating layer is partially absent. As in the above case, when the insulating layer in the laminate is etched, the etching shape of the insulating layer is uneven.

Figure 1:
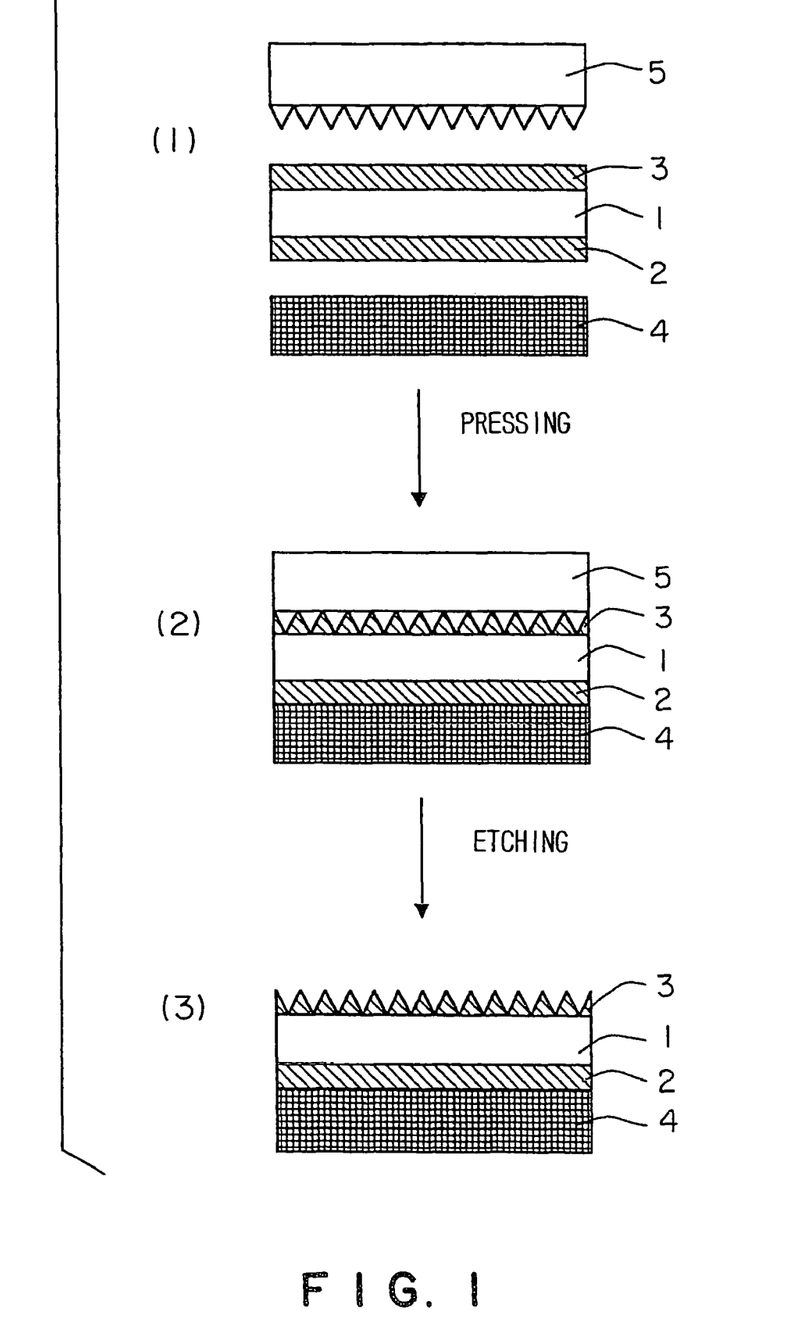
FIG. 1 is a flow diagram of an example of the production of a laminate for an electronic circuit component by pressing, shown for comparison with the present invention, wherein a laminate is produced based on common knowledge of the conventional technique wherein the adhesive resin layer in the insulating layer is made as thin as possible.

FIG. 1 is a flow diagram of the production of a laminate for an electronic circuit component, for example, by pressing, shown for comparison with the present invention, wherein a laminate is produced based on common knowledge of the conventional technique wherein the adhesive resin layer in the insulating layer is made as thin as possible. Specifically, in the production process shown in FIG. 1 (typical diagram), an insulating layer comprising a core insulating layer 1, an adhesive insulating layer 2 provided on one side of the core insulating layer 1 and an adhesive insulating layer 3 provided on the other side of the core insulating layer 1 is sandwiched between a first inorganic material layer 4 and a second inorganic material layer 5 (FIG. 1 (1)), the assembly is pressed to produce a comparative laminate (FIG. 1 (2)), and the second inorganic material layer 5 is removed by etching (FIG. 1 (3)). The laminate shown in FIG. 1 is an example of the case where the thickness of the adhesive insulating layer 3 in the insulating layer is equal to the average height of the surface irregularities of the second inorganic material layer 5.

Figure 2A:
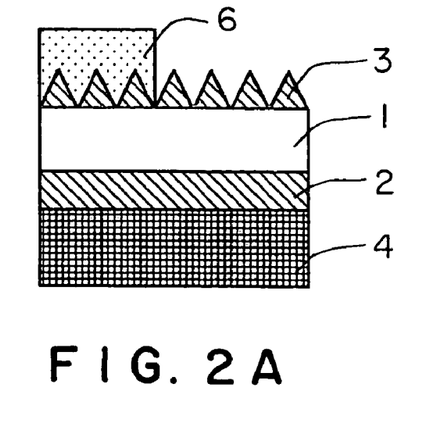
Figure 2B:
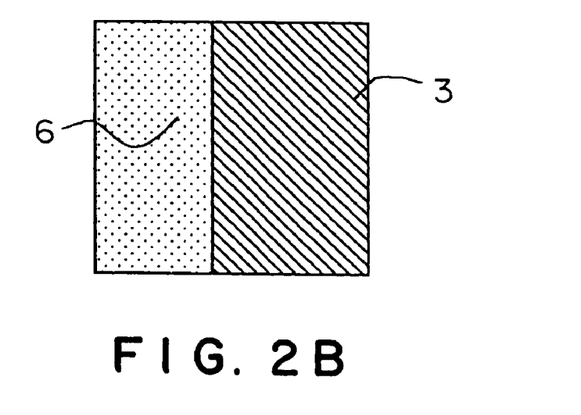

FIG. 2 is a typical diagram showing the laminate, shown in FIG. 1 (3) with the second inorganic material layer 5 being removed by etching, masked by coating a part of the adhesive insulating layer 3 with a masking agent 6, wherein FIG. 2A is a cross-sectional view showing the layer construction of the laminate and FIG. 2B a top view of the laminate.

Figure 3A:
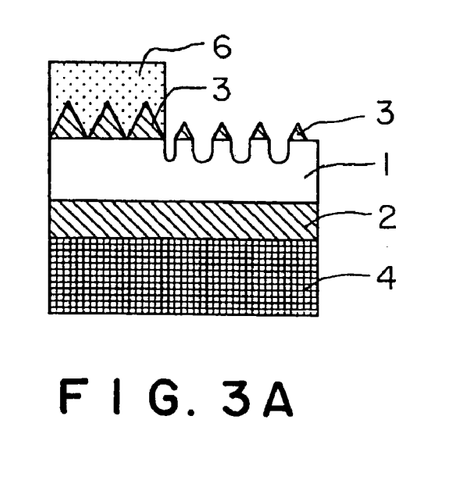
FIGS. 3A, 3B, 3C, and 3D are cross-sectional views illustrating wet etching wherein an etching process from the start of wet etching of the laminate shown in FIG. 2, which has been partially masked with a masking agent, to the removal of the masking agent to complete the etching is shown in the order of FIGS. 3A to 3D.
Figure 3B:
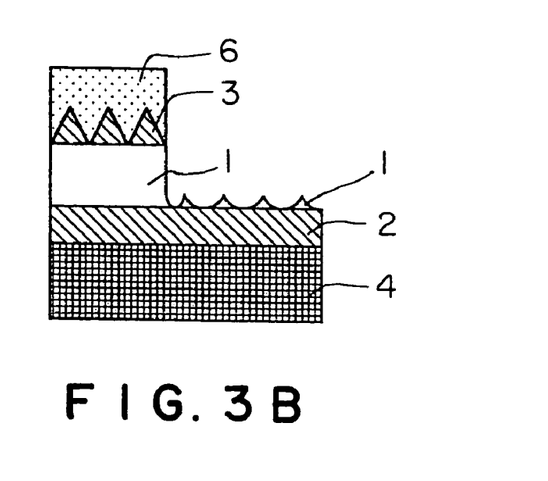
Figure 3C:
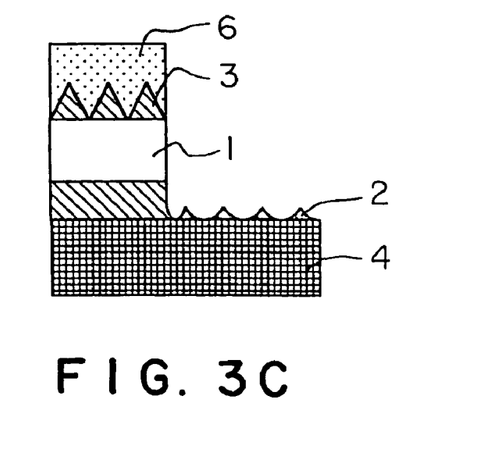
Figure 3D:
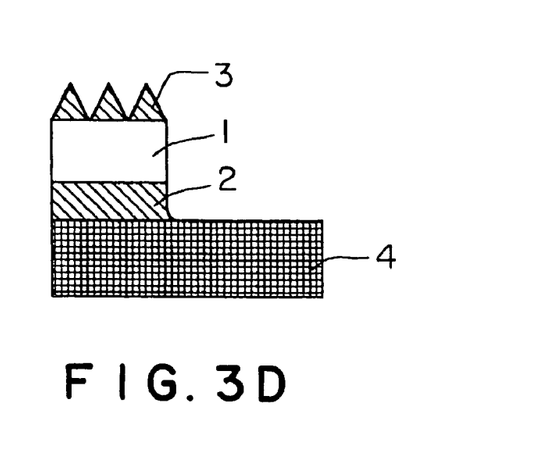
Figure 4A:
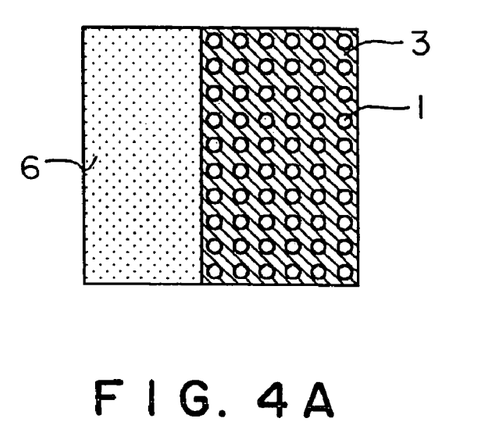
FIGS. 4A, 4B, 4C, and 4D are top views corresponding to FIGS. 3A to 3D, respectively.
Figure 4B:
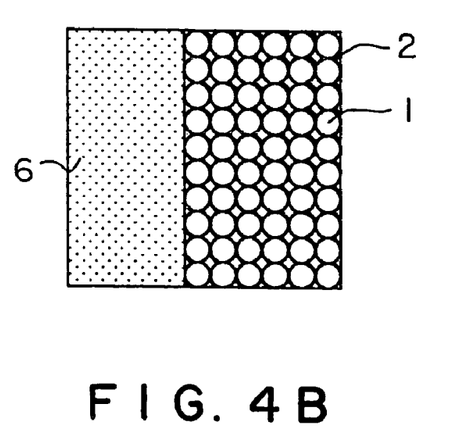
Figure 4C:
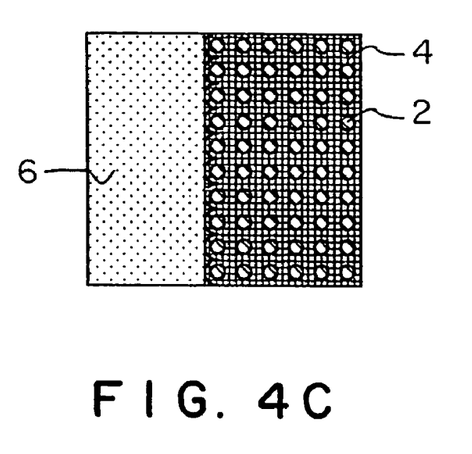
Figure 4D:
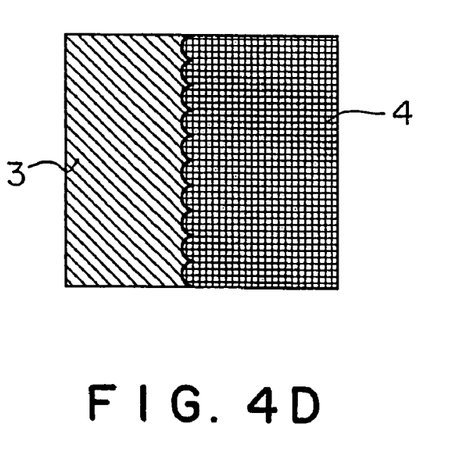

FIG. 3 is a schematic diagram illustrating an example of wet etching of the laminate shown in FIG. 2, wherein an etching process from the start of wet etching of the laminate, which has been partially masked with a masking agent 6, to the removal of the masking agent 6 to complete the etching is shown in the order of FIGS. 3A to 3D. FIG. 3A shows such a state that, except for the site masked with the masking agent 6, an etching liquid reaches the core insulating layer 1 and the core insulating layer 1 begins to be attacked by the etching liquid. In many cases, since the etching rate of the core insulating layer 1 is higher than that of the adhesive insulating layer 3, the core insulating layer 1 is rapidly attacked by the etching liquid. FIG. 3B shows such a state that, except for the site masked with the masking agent 6, the core insulating layer 1 has been substantially completely attacked by the etching liquid. FIG. 3C shows such a state that, except for the site masked with the masking agent 6, the adhesive insulating layer 2 has been substantially completely attacked by the etching liquid. FIG. 3D shows such a state that, after the completion of the wet etching, the masking agent 6 has been removed. Thus, in the wet etching, the difference in etching rate between the insulating unit layers constituting the insulating layers greatly affects the etching shape and poses a problem that the boundary of the etching shape is not smooth.

FIGS. 4A to 4D (FIG. 4) are top views corresponding to FIGS. 3A to 3D, respectively.

As shown in FIGS. 3 and 4, when the laminate produced based on common knowledge of the prior art technique, in which the adhesive resin layer in the insulating layer is made as thin as possible, is applied to wet etching, wavy unevenness of the etching shape of the insulating layer occurs.

The laminate for an electronic circuit component shown in FIGS. 1 to 4 is an example of the laminate in which the adhesive insulating layer in the insulating layer having a thickness which has hitherto been considered to be ideal for suppressing the occurrence of warpage and has been determined by taking into consideration the adhesion to the metal layer. As described above, the surface irregularities of the inorganic material such as the metal in the laminate contribute to an improvement in the adhesion of the inorganic material to the adhesive insulating layer. Since, however, the irregularities bite into the adhesive insulating layer to such an extent that is equal to the thickness of the adhesive insulating layer, when etching is carried out in this state, the etching shape after the removal of the masking agent is wavy (FIG. 4D). That is, a desired shape conforming to the mask cannot be provided, and the etching shape of the whole insulating layer is uneven. Thus, the accuracy is unreliable. The problem of the uneven complicated etching shape is likely to be led to dusting.

Accordingly, an object of the present invention is to provide a laminate comprising an insulating layer, which can realize an improvement in the shape of a patterned insulating layer, formed by patterning the insulating layer through wet etching, achieved by drawing attention to the state of irregularities transferred from the surface of the metal layer and, at the same time, is stable in the etching shape of the insulating layer and thus can suppress dusting, to provide an insulating film comprising the insulating layer, and to provide an electronic circuit component comprising a pattern of the insulating layer.

DISCLOSURE OF THE INVENTION

As a result of extensive and intensive studies, the present inventors have found that, in a laminate comprising: an insulating layer comprising a core insulating layer and an adhesive insulating layer provided on both surfaces of the core insulating layer; and an inorganic material layer formed of a metal or the like stacked on the insulating layer, when the shape of surface irregularities of the inorganic material layer has been transferred onto the adhesive insulating layer in the insulating layer and the thickness of the adhesive insulating layer is larger than the average height of the surface irregularities of the inorganic material layer, wet etching of the insulating layer can provide a good etching shape. The present inventors have further found that, when the thickness of the adhesive insulating layer is larger, the degree of influence of the surface irregularities of the inorganic material layer on the etching shape of the insulating layer is smaller.

Accordingly, the present inventors have attempted to prevent the formation of through-holes in the adhesive insulating layer by making the thickness of the adhesive insulating layer larger than the average height of surface irregularities of the inorganic material layer and thus to prevent the core insulating layer from being exposed and, as a result, could have realized a laminate that comprises an adhesive insulating layer having a larger thickness than the mean roughness Rz (JIS (Japanese Industrial Standards) C 6515) of the surface of an inorganic material layer in contact with the insulating layer and, upon wet etching, can provide a good etching shape and has suppressed dusting properties.

Specifically, the laminate of the present invention has a layer construction of first inorganic material layer-insulating layer-second inorganic material layer or a layer construction of inorganic material layer-insulating layer, characterized in that the insulating layer comprises a laminate of two or more wet etchable insulating unit layers and, at the interface between the inorganic material layer and the insulating layer, surface irregularities of the inorganic material layer have been transferred onto the insulating layer, and the average height of the irregularities transferred onto at least one layer in the insulating layer is less than the thickness of the outermost insulating unit layer in the insulating layer.

The insulating film of the present invention is characterized by comprising a laminate of two or more wet etchable insulating unit layers, said insulating film being adaptable for stacking on an inorganic material layer, said inorganic material layer having surface irregularities of which the average height is less than the thickness of the outermost insulating unit layer in the insulating layer.

In the laminate or the insulating film according to the present invention, preferably, the thickness of the adhesive insulating layer is 1.1 to 3 times Rz. Further, the thickness of the adhesive insulating layer is preferably not more than the half of the thickness of the low-expansion core insulating layer from the viewpoint of reducing the warpage of the substrate and preventing dusting.

Rz referred to in the present invention is as specified in JIS C 6515. Rz may be measured by providing a profile curve of irregularities and determining the difference between the average value of the distances of five highest profile peaks from a reference line in a reference length and the average value of the distances of five deepest profile valleys from the reference line in a reference length and expressing this difference in micrometer (μm).

The electronic circuit component according to the present invention is an electronic circuit component produced by wet etching the laminate, particularly preferably a suspension for a hard disk drive, produced by wet etching.

BRIEF DESCRIPTION OF THE DRAWINGS

FIGS. 2A and 2B are typical diagrams showing the laminate, shown in FIG. 1 (3) with the second inorganic material layer being removed by etching, masked by coating a part of the adhesive insulating layer with a masking agent, wherein FIG. 2A is a cross-sectional view showing the layer construction of the laminate and FIG. 2B a top view of the laminate;

FIGS. 6A and 6B are typical diagrams showing the laminate, shown in FIG. 5 (3) with the second inorganic material layer being removed by etching, masked by coating a part of the adhesive insulating layer with a masking agent, wherein FIG. 6A is a cross-sectional view showing the layer construction of the laminate and FIG. 6B a top view of the laminate;

BEST MODE FOR CARRYING OUT THE INVENTION

The present invention will be described in more detail.

Figure 5:
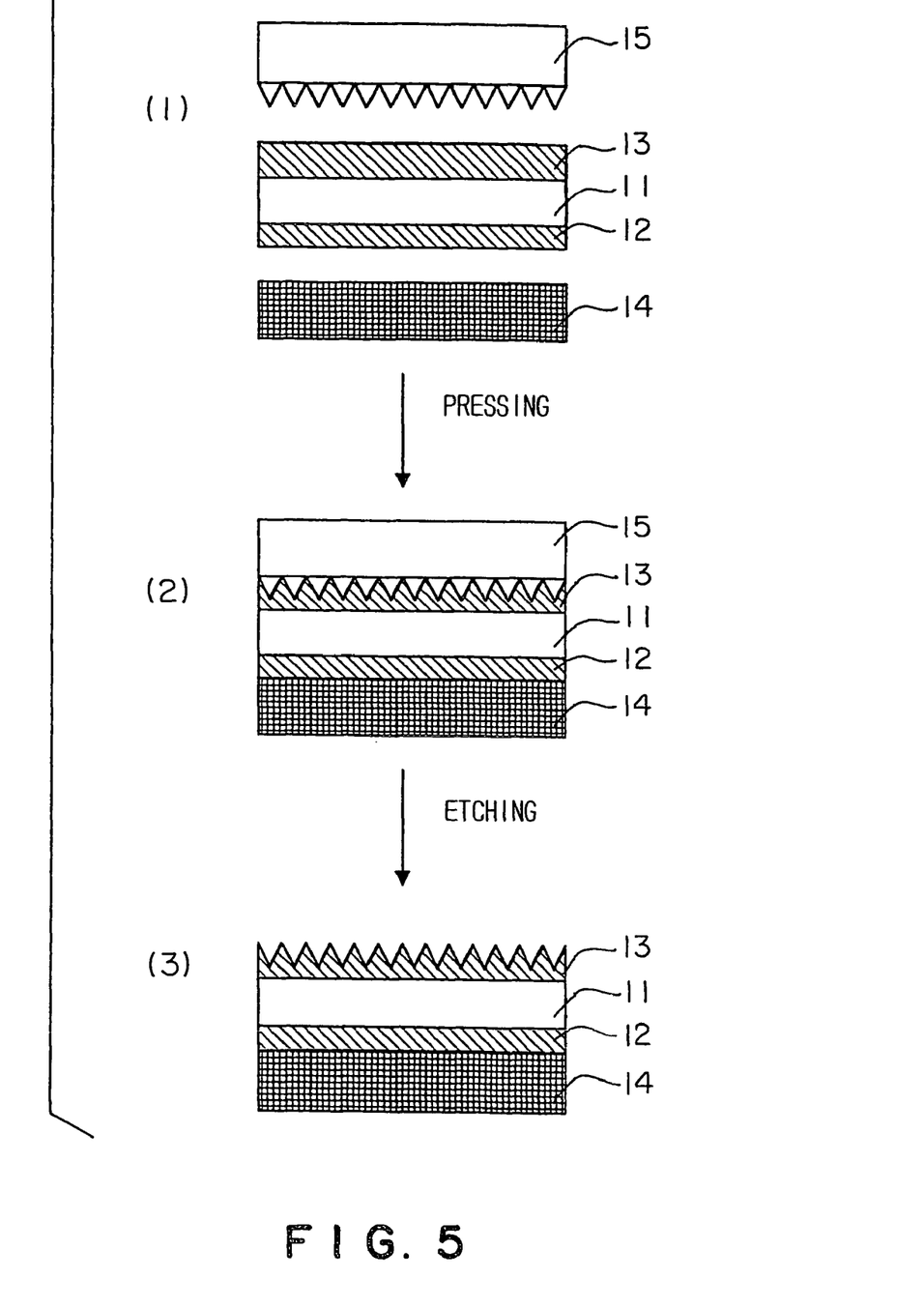
FIG. 5 is a schematic flow diagram of an embodiment of a production process of the laminate according to the present invention wherein the laminate is produced by pressing.

FIG. 5 is a typical schematic flow diagram of an embodiment of a production process of a laminate according to the present invention, wherein the laminate is produced by pressing. In FIG. 5, an insulating layer comprising a core insulating layer 11, an adhesive insulating layer 12 provided on one side of the core insulating layer 11 and an adhesive insulating layer 13 provided on the other side of the core insulating layer 11 is sandwiched between a first inorganic material layer 14 and a second inorganic material layer 15 (FIG. 5 (1)), the assembly is pressed to produce a laminate according to the present invention (FIG. 5 (2)), and the second inorganic material layer 15 is removed by etching (FIG. 5 (3)). The thickness of the adhesive insulating layer 13 shown in FIG. 5 is larger than the average height of surface irregularities of the second inorganic material layer 15.

Figure 6A:
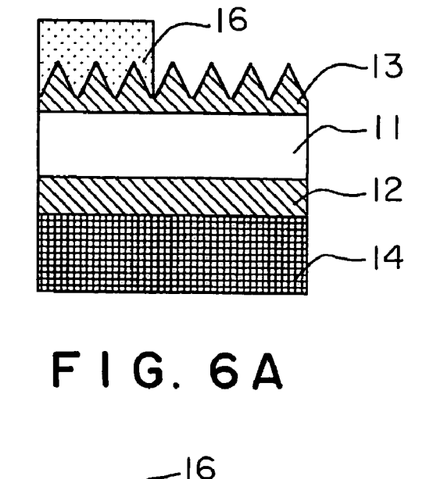
Figure 6B:
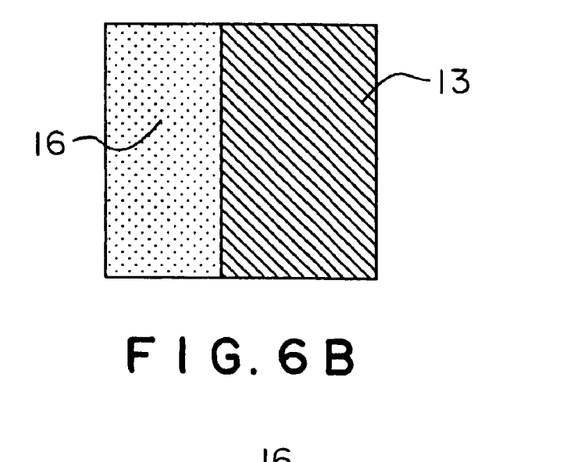

FIG. 6 is a typical diagram showing the laminate, shown in FIG. 5 (3) with the second inorganic material layer 15 being removed by etching, masked by coating a part of the adhesive insulating layer 13 with a masking agent 16, wherein FIG. 6A is a cross-sectional view showing the layer construction of the laminate and FIG. 6B a top view of the laminate.

Figures 7A, 7C:
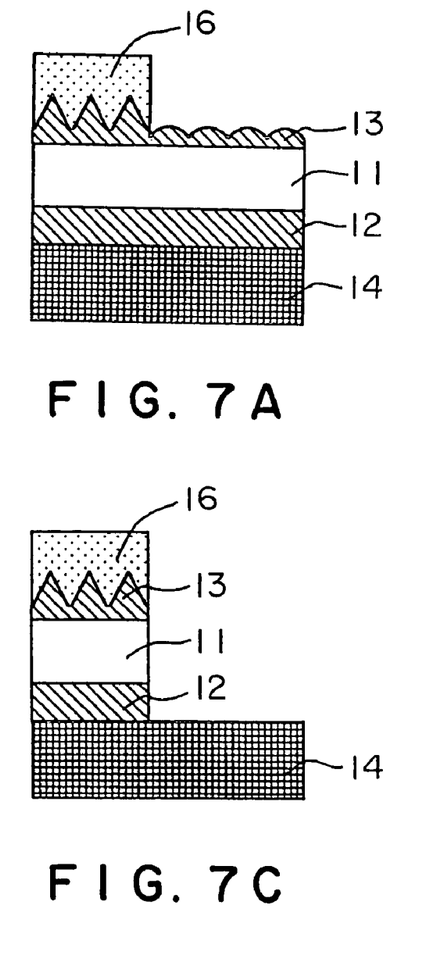
FIGS. 7A, 7B, 7C, and 7D are diagrams illustrating wet etching wherein an etching process from the start of wet etching of the laminate shown in FIG. 6, which has been partially masked with a masking agent, to the removal of the masking agent to complete the etching is shown in the order of FIGS. 7A to 7D.
Figures 7B, 7D:
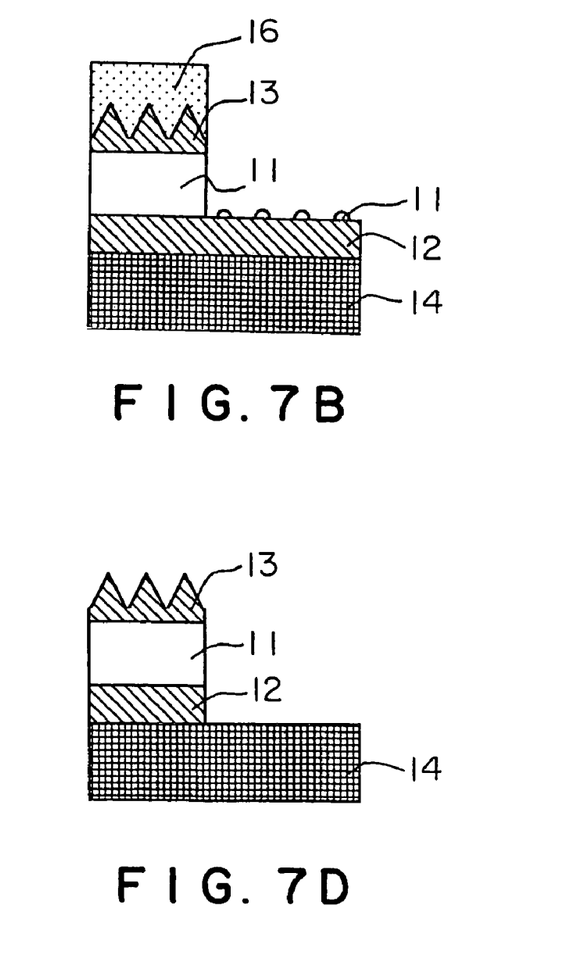
Figure 8A:
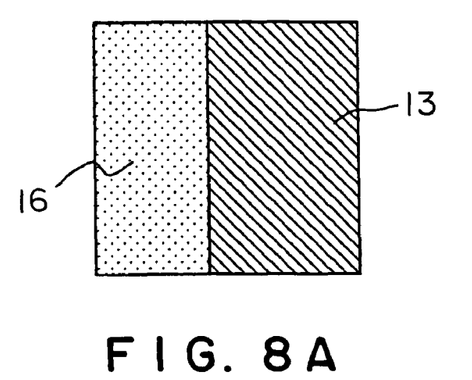
FIGS. 8A, 8B, 8C, and 8D are top views corresponding to FIGS. 7A to 7D, respectively.
Figure 8B:
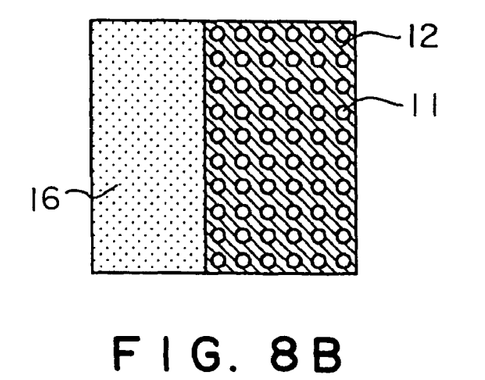
Figure 8C:
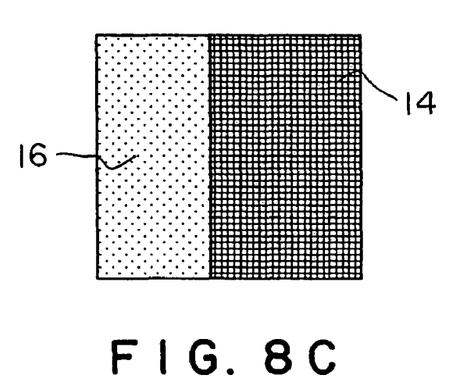
Figure 8D:
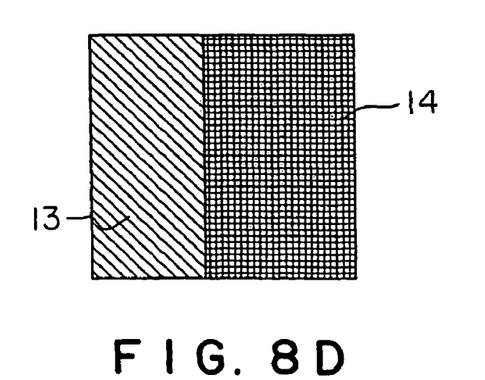

FIG. 7 is a schematic diagram illustrating wet etching of the laminate shown in FIG. 6, wherein an etching process from the start of wet etching of the laminate, which has been partially masked with a masking agent 16, to the removal of the masking agent 16 to complete the etching is shown in the order of FIGS. 7A to 7D. FIG. 7A shows such a state that, except for the site masked with the masking agent 16, the adhesive insulating layer 13 is being attacked by an etching liquid. Since the thickness of the adhesive insulating layer 13 is larger than the average height of surface irregularities of the second inorganic material layer 15, upon attack by the etching liquid, as compared with the case where the thickness of the adhesive insulating layer 13 is smaller, surface irregularities of the adhesive insulating layer 13 are gentle. FIG. 7B shows such a state that, except for the site masked with the masking agent 16, the core insulating layer 11 has been substantially completely attacked by the etching liquid. Irregularities formed by the residual core insulating layer 11 are also very gentle, indicating that the influence of gentle irregularities of the adhesive insulating layer 13 in FIG. 7A is further reduced. FIG. 7C shows such a state that, except for the site masked with the masking agent 16, the adhesive insulating layer 12 has been completely attacked by the etching liquid. An etching pattern of the insulating layer thus formed is linear and is substantially free from wavy uneven or other irregular shapes. FIG. 7D shows such a state that, after the completion of the wet etching, the masking agent 16 has been removed.

FIGS. 8A to 8D (FIG. 8) are top views corresponding to FIGS. 7A to 7D, respectively.

In the insulating layer according to the present invention, the thickness of the adhesive insulating layer 13 is larger than the average height of surface irregularities of the second inorganic material layer 15. By virtue of this construction, as shown in FIGS. 7 and 8, the formation of wavy uneven etching shape can be suppressed in the etching pattern of the insulating layer which is finally formed by wet etching, and the boundary of the pattern shape is smooth. The present invention is characterized in that problems inherently posed in wet etching, which affects etching shape due to a large influence of a difference in etching rate, can be reduced.

The insulating layer in the laminate or the insulating film according to the present invention comprises two or more insulating unit layers stacked on top of each other or one another and preferably has a layer construction of adhesive insulating layer-core insulating layer-adhesive insulating layer. The insulating unit layers constituting the insulating layer or the insulating film are generally formed of an organic material. However, at least one of the insulating unit layers constituting the insulating layer or the insulating film may contain an inorganic material. Inorganic materials usable herein include, for example, colloidal silica, glass fiber, and other inorganic fillers.

The coefficient of linear thermal expansion of at least one of the insulating unit layers constituting the insulating layer or the insulating film is preferably not more than 30 ppm from the viewpoint of rendering the coefficient of linear thermal expansion close to that of the inorganic material layer. More preferably, the difference in coefficient of linear thermal expansion between at least one of the insulating unit layers constituting the insulating layer or the insulating film and the inorganic material layer is not more than 15 ppm. The core insulating layer is particularly preferably formed of a material, which has the same coefficient of thermal expansion as the inorganic material layer, for example, a low-expansion polyimide from the viewpoint of preventing the warpage of the laminate.

On the other hand, the adhesive insulating layer is mainly formed of a thermoplastic resin from the viewpoint of imparting adhesive properties. In this case, the coefficient of thermal expansion of the adhesive insulating layer is larger than that of the metal layer, and this large coefficient of thermal expansion of the adhesive insulating layer is causative of warpage of the laminate. Therefore, preferably, the warpage is prevented by rendering the thickness of the adhesive insulating layer smaller than the thickness of the core insulating layer. In the insulating layer or the insulating film according to the present invention, the expression "adhesion of the adhesive insulating layer" means that the strength of adhesion to the inorganic material layer is not less than 100 g/cm. Thermoplastic polyimides may be mentioned as specific suitable materials having the above property. However, materials having the above property are not particularly limited to the thermoplastic polyimides only, and any resin may be used independently of the presence or absence of an imide bond so far as the resin has a combination of adhesive properties, heat resistance, and insulating properties. Since the adhesive strength of the adhesive insulating layer developed sometimes varies depending upon the relationship with the adhesion to the inorganic material layer as the adherend, the optimal material should be properly selected according to the type of the adherend or according to properties required of the laminate. Therefore, it is not always necessary to use an identical material, for example, polyimide resins having an identical composition. In some cases, however, an identical material is used.

In the case of a construction wherein the core insulating layer is sandwiched between two adhesive insulating layers, warpage of the laminate does not occur when the total thickness of the two adhesive insulating layers is smaller than the thickness of the core insulating layer. Ideally, the total thickness of the two adhesive insulating layers is not more than the half of the thickness of the core insulating layer. Therefore, the thickness of one adhesive insulating layer is preferably not more than a quarter of the thickness of the core insulating layer.

In the present invention, the weight average molecular weight of the resin usable in the adhesive insulating layer is generally preferably not less than 6,000 and not more than 500,000 although the preferred molecular weight varies depending upon the molecular structure. The weight average molecular weight is particularly preferably not less than 8,000 and not more than 100,000. When the molecular weight is not less than 500,000, the formation of an even coating is difficult, while, when the molecular weight is not more than 6,000, the film formability is poor making it difficult to form an even adhesive coating.

The material for the adhesive insulating layer may be shaped by coating a solution of the material, or alternatively may be shaped by other methods. Further, the material may be shaped in the form of a precursor or a derivative thereof followed by treatment to provide a desired structure.

The inorganic material used in the laminate according to the present invention broadly refers to materials which are not organic materials. Examples of inorganic materials include, but are not particularly limited to, metals, single-crystal silicon, and metal oxides. Metals include, but are not particularly limited to, copper, iron, and alloys such as stainless steel. Further, metals subjected to surface treatment, that is, metals having on their surface a nonmetallic inorganic material layer, for example, a ceramic layer, may also be used. In particular, when the laminate according to the present invention is used in a suspension for a hard disk drive, since spring properties are required, a laminate of a highly elastic metal, such as stainless steel, and a copper foil or an alloy copper foil for wiring is preferred.

Examples of a combination of a material for the first inorganic material layer with a material for the second inorganic material layer include:

(a) a combination wherein both the first inorganic material layer and the second inorganic material layer are formed of copper or surface treated copper;

(b) a combination wherein both the first inorganic material layer and the second inorganic material layer are formed of alloy copper or surface treated alloy copper;

(c) a combination wherein both the first inorganic material layer and the second inorganic material layer are formed of stainless steel or surface treated stainless steel;

(d) a combination wherein any one of the first inorganic material layer and the second inorganic material layer is formed of stainless steel or surface treated stainless steel while the other is formed of copper or surface treated copper; and (e) a combination wherein any one of the first inorganic material layer and the second inorganic material layer is formed of stainless steel or surface treated stainless steel while the other is formed of alloy copper or surface treated alloy copper.

In the wet etching of the insulating layer in the laminate according to the present invention, however, the type of the inorganic material is not particularly limited, and any inorganic material may be stacked on the insulating layer so far as the inorganic material meets the objective of the present invention.

The laminate according to the present invention may be produced by any method without particular limitation so far as the final layer construction of the laminate is the same. Examples of production methods include: a method (cast method) wherein a solution of a material for the insulating layer is coated directly onto the surface of the inorganic material to form one or more stacked layers as the insulating layer, another inorganic material is optionally laminated, and the assembly is then thermocompression bonded; a method (film method) wherein an adhesive insulating layer is formed on a previously provided insulating film (core insulating layer), an inorganic material is stacked and thermocompression bonded onto the top surface and the back surface of the adhesive insulating layer; and a method wherein, after the formation of an adhesive insulating layer onto an insulating film as a core layer, an inorganic material layer is formed by vapor deposition, sputtering, plating or the like.

The lower limit of the mean roughness Rz of the inorganic material on its surface, which, together with the insulating layer, forms an interface, is preferably 0.2 μm from the viewpoint of developing adhesion. The upper limit of Rz is preferably 15 μm because, when Rz exceeds 15 μm, the formation of a fine pattern is difficult. An inorganic material having Rz in the range of 0.5 to 10 μm is easily available as a general-purpose commercially available metal foil and thus is particularly preferred from the practical point of view.

The insulating layer in the insulating film according to the present invention may take the form of a coating of a resin, or alternatively may take the form of a resin film. The insulating film according to the present invention may be wet etched after lamination onto an inorganic material layer to form a laminate, or alternatively may be wet etched before the lamination. Specific embodiments of use of the insulating film according to the present invention are as follows.

(a) An inorganic material layer as a substrate with wiring formed therein is adhered to both sides of an insulating film, and the insulating film is then wet etched.

(b) After wiring is formed on a substrate of an inorganic material layer, an insulating film is adhered. Thereafter, an inorganic material layer is applied onto the surface of the insulating film, and the inorganic material layer and the insulating film are wet etched.

(c) A previously wet etched insulating film is applied onto an inorganic material layer.

Figure 9:
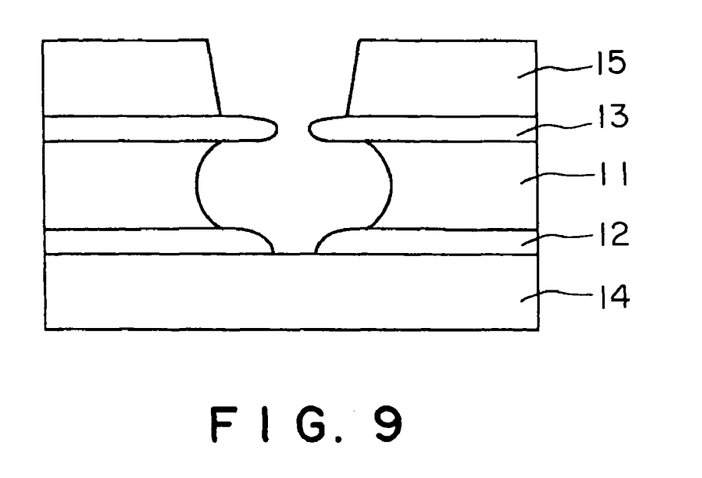
FIG. 9 is a schematic cross-sectional view showing an example of etching of a laminate, illustrating an unfavorable phenomenon wherein, when the etching rate of the adhesive insulating layer is excessively low, the etching shape is such that the upper adhesive insulating layer and the lower adhesive insulating layer are left in a projected form.

In etching of the laminate by a wet process, when the insulating unit layers constituting the insulating layer are different from each other in etching rate, the etching shape is not generally linear. In this case, the layer having a lower etching rate remains unetched. As shown in FIG. 9, in the laminate, when the etching rate of the adhesive insulating layer is excessively low, the etching shape is such that the upper adhesive insulating layer and the lower adhesive insulating layer are left in a projected form. On the other hand, when the etching rate of the adhesive insulating layer is excessively high, the etching shape is such that the adhesive insulating layer is etched at an earlier stage than the core insulating layer. As a result, the etching shape is such that the center portion in the insulating layer is left in a projected form. Ideally, all the layers, i.e., the core insulating layer and the adhesive insulating layers, constituting the insulating layer have an identical etching rate. In this case, the realization of a sharp etching shape is expected. In etching by a wet process, however, in many cases, the etching rate of the adhesive insulating layer is significantly different from the etching rate of the core insulating layer.

When the etching rates of the layers constituting the insulating layer fall within a predetermined range, even in the wet process, the etching of the whole insulating layer proceeds evenly and, consequently, a good etching shape can be provided. This makes it possible to apply wet etching to even a laminate for wireless suspensions for which meeting strict specification has hitherto been required. Therefore, as compared with dry etching, the etching can be completed in a shorter time, leading to improved productivity.

For example, in the case of wet etching of a polyimide, for example, an alkali-amine etching liquid as disclosed in Japanese Patent Laid-Open No. 97081/1998 may be mentioned as a suitable etching liquid. The etching liquid, however, is not particularly limited to this only. Specifically, the etching liquid is preferably an aqueous alkaline solution and is more preferably a basic chemical liquid having a pH value of not less than 9, still more preferably not less than 11. Further, the etching liquid may be an organic alkali or an inorganic alkali or a mixture of an organic alkali with an inorganic alkali.

The temperature, at which wet etching is carried out, is not particularly limited so far as the etchant can exhibit the desired function. In particular, when the etchant is an aqueous solution, the etching temperature is preferably in the range of 0 to 110° C. When the temperature is low, the etching rate is generally low. Further, when the temperature is high, the working efficiency is not good due to the occurrence of boiling or the like. For this reason, more preferably, the etching temperature is in the range of 30 to 90° C. Still more preferably, wet etching is carried out at a temperature in the range of 50 to 90° C. from the viewpoints of suppressing a change in composition of the etchant due to the evaporation of components or the like and, in addition, shortening the etching time.

Electronic Circuit Component

An electronic circuit component can be generally produced by the following method.

At the outset, a photosensitive resin layer is formed by coating or lamination onto the surface of the metal on its circuit formation side in the laminate according to the present invention. A mask with a desired pattern image drawn thereon is brought into intimate contact with the surface of the photosensitive resin layer, and an electromagnetic radiation with a wavelength, to which the photosensitive resin is sensitive, is applied. The exposed portion in the case of a positive-working photosensitive resin or the unexposed portion in the case of a negative-working photosensitive resin is eluted with a predetermined developing solution to form a desired circuit image on the metal. The assembly in this stage is dipped in a solution, which can dissolve a metal, such as an aqueous ferric chloride solution, or alternatively the solution is sprayed on the substrate, whereby the exposed metal is eluted. Thereafter, the photosensitive resin is separated with a predetermined separation solution to form a circuit.

Next, likewise, a mask with a desired pattern image drawn thereon is brought into intimate contact with the circuit formed on the surface of the metal, and the insulating layer is patterned by a dry or wet process.

Electronic circuit components, to which the laminate according to the present invention can be applied, include, for example, wiring boards such as flexible printed boards, semiconductor-related components such as CSP (chip scale package), and devices such as nozzles of toner jet printers, particularly suspensions for hard disk drives.

For both a suspension, which comprises an inorganic material layer formed of stainless steel and has been prepared by a plasma etching process, and a suspension, which is the same as the above suspension except for the use of wet etching instead of the plasma etching process in the preparation thereof, the surface of the stainless steel was analyzed. As a result, it was confirmed that, for the suspension prepared by the plasma etching process, the resin used in the insulating layer was removed and the exposed metal surface was reacted with plasma to convert the metal surface to form a surface of an inorganic nitride and/or an inorganic fluoride. In the case of the plasma etching process, the reason why the inorganic nitride and/or the inorganic fluoride are detected on the metal surface is probably that, since the plasma etching gas has a high temperature of 200° C. or above, after the removal of the resin constituting the insulating layer, such as a polyimide, the surface of the stainless steel is exposed and the exposed surface of the stainless steel is reacted with plasma to form the inorganic nitride and/or the inorganic fluoride.

On the other hand, for the suspension which realized a good etching shape by the wet etching process, neither inorganic nitride nor inorganic fluoride was detected from the surface of the stainless steel exposed as a result of the removal of the polyimide. That is, it was confirmed that any surface change did not occur. This is a feature inherent in electronic circuit components, such as suspensions, which the present invention has realized for the first time by a wet etching process. In the wet etching process, the reason why any change in metal surface does not occur is believed to be as follows. An alkaline solution, which is a chemical solution mainly used in the wet etching, is generally lower in reactivity with a metal than in reactivity with an organic material. Further, the treatment temperature is low and is 100° C. or below, and the treatment time is short and is a few minutes. By virtue of these facts, it is considered that the surface of the stainless steel exposed after the removal of the polyimide is less likely to be changed.

EXAMPLES

Synthesis examples of three polyimide resins used in the following examples will be described.

Synthesis Example 1

Synthesis of Nonthermoplastic Polyimide Resin

Diamino compounds, i.e., 4,4'-diamino-2'-methoxybenzanilide (20.5 g) and 4,4'-diaminodiphenyl ether (10.6 g), were dissolved in 340 g of DMAc as a solvent with stirring in a 50-ml separable flask to prepare a solution. Next, the solution was cooled in an ice bath, and 28.8 g of pyromellitic anhydride as a tetracarboxylic acid dianhydride was added to the cooled solution under a nitrogen gas stream. Thereafter, the temperature of the solution was returned to room temperature, and stirring was continued for 3 hr to allow a polymerization reaction to proceed to prepare viscous polyimide precursor solution A.

This polyimide precursor solution A was coated onto a stainless steel foil SUS 304 manufactured by Nippon Steel Corp. by means of an applicator so that the thickness of the coating after curing was 15 μm. The coating was dried at 110° C. for 5 min, and the dried coating was then heat treated stepwise, i.e., at 130° C. for 3 min, at 160° C. for 3 min, at 200° C. for 3 min, at 250° C. for 3 min, at 300° C. for 3 min, and then at 360° C. for 3 min, to form a polyimide layer on the stainless steel foil. Next, for an etching test, the polyimide layer with the stainless steel foil remaining unremoved was immersed in a polyimide etching solution (TPE-3000 (tradename), manufactured by Toray Engineering Co., Ltd.) of 80° C. As a result, the polyimide layer was etched at a rate of 15 μm/min.

Synthesis Example 2

Synthesis of Thermoplastic Polyimide Resin

Diamino compounds, i.e., 1,3-bis(4-aminophenoxy)-2,2'-dimethylpropane (22.1 g) and 3,4'-diaminodiphenyl ether (6.6 g), were dissolved in 340 g of DMAc as a solvent with stirring in a 500-ml separable flask to prepare a solution. Next, 9.7 g of pyromellitic anhydride as a tetracarboxylic acid dianhydride and 21.5 g of 3,4,3',4'-benzophenonetetracarboxylic acid dianhydride were added to the solution under a nitrogen gas stream. Thereafter, stirring was continued for 3 hr to allow a polymerization reaction to proceed to prepare viscous polyimide precursor solution B.

This polyimide precursor solution B was coated onto a stainless steel foil SUS 304 manufactured by Nippon Steel Corp. by means of an applicator so that the thickness of the coating after curing was 15 μm. The coating was dried at 110° C. for 5 min, and the dried coating was then heat treated stepwise, i.e., at 130° C. for 3 min, at 160° C. for 3 min, at 200° C. for 3 min, at 250° C. for 3 min, at 300° C. for 3 min, and then at 360° C. for 3 min, to form a polyimide layer on the stainless steel foil. The polyimide layer thus formed was subjected to an etching test in the same manner as in Synthesis Example 1. As a result, the etching rate of the polyimide layer was found to be 8 μm/min.

Synthesis Example 3

Synthesis of Thermoplastic Polyimide Resin

Diamino compounds, i.e., 1,3-bis(3-aminophenoxy)benzene (22.6 g) and p-phenylenediamine (3.6 g) were dissolved in 340 g of DMAc as a solvent with stirring in a 500-ml separable flask to prepare a solution. Next, 9.7 g of pyromellitic anhydride as a tetracarboxylic acid dianhydride and 24.1 g of 3,4,3',4'-diphenylsulfonetetracarboxylic acid dianhydride were added to the solution under a nitrogen gas stream. Thereafter, stirring was continued for 3 hr to allow a polymerization reaction to proceed to prepare viscous polyimide precursor solution C.

This polyimide precursor solution C was coated onto a stainless steel foil SUS 304 manufactured by Nippon Steel Corp. by means of an applicator so that the thickness of the coating after curing was 15 μm. The coating was dried at 110° C. for 5 min, and the dried coating was then heat treated stepwise, i.e., at 130° C. for 3 min, at 160° C. for 3 min, at 200° C. for 3 min, at 250° C. for 3 min, at 300° C. for 3 min, and then at 360° C. for 3 min, to form a polyimide layer on the stainless steel foil. The polyimide layer thus formed was subjected to an etching test in the same manner as in Synthesis Example 1. As a result, the etching rate of the polyimide layer was found to be 14 μm/min.

Formation of Laminate and Evaluation of Shape of Etching Pattern

Thermoplastic polyimide precursor resin solution B prepared in Synthesis Example 2 was coated onto a stainless steel foil SUS 304 manufactured by Nippon Steel Corp. by means of an applicator so that the thickness of the coating after curing was 1 μm. The coating was dried at 110° C. for 5 min. Low-thermal expansion polyimide precursor resin solution A prepared in Synthesis Example 1 was then coated onto the dried coating so that the thickness of the coating after curing was 14 μm. The coating was dried at 110° C. for 5 min to prepare a film formed material. The above procedure was repeated to prepare another film formed material. Thus, two film formed materials were provided. Thermoplastic polyimide precursor resin solution C prepared in Synthesis Example 3 was coated to a thickness of 1.5 μm onto one of the film formed materials and to a thickness of 3 μm onto the other film formed material. These materials were then dried at 110° C. for 5 min. Thereafter, the materials were heat treated stepwise, i.e., at 130° C. for 3 min, at 160° C. for 3 min, at 200° C. for 3 min, at 250° C. for 3 min, at 300° C. for 3 min, and then at 360° C. for 3 min. Thus, two materials were prepared in which a polyimide having a three-layer structure of thermoplastic polyimide layer B, low-expansion polyimide layer A, and nonthermoplastic polyimide layer C were formed on the stainless steel foil. The two materials were different from each other in the thickness of the nonthermoplastic polyimide layer C. A copper alloy (C 7025 copper alloy, manufactured by Olin Corp.), which had a roughened surface having a mean roughness Rz of 1.6 μm, was provided and was put on top of the materials so that the rough surface was brought into contact with the thermoplastic polyimide layer C on the stainless steel foil. Contact bonding was then carried out by means of a vacuum press at 330° C. for 60 min. Thus, two laminates were prepared. These laminates had the same layer construction, i.e., a layer construction of stainless steel foil/thermoplastic polyimide layer B/nonthermoplastic polyimide layer A/thermoplastic polyimide layer C/copper alloy foil and were different from each other in thickness of the thermoplastic polyimide layer C (1.5 μm for one of the laminates and 3 μm for the other laminate).

A mask was provided on the SUS side of the laminate, and the masked laminate was immersed in a ferric chloride solution to etch the copper foil. A 50 μm-thick alkali development-type dry film resist was laminated by a hot laminator onto the exposed surface of the thermoplastic polyimide layer C at a speed of 6.5 m/min under conditions of roll surface temperature 150° C. and line pressure 2 to 4 kg/cm, and the laminate was then allowed to stand at room temperature for 15 min. Thereafter, exposure was carried out using a predetermined mask by means of an intimate contact exposure system at 100 mJ/cm². After standing at room temperature for 15 min, the dry film resist was developed with a 1 wt % aqueous $Na_2CO_3$ solution under conditions of temperature 30° C., spray pressure 2 kg, and development time 40 sec. Thereafter, the laminate was dried and was then immersed in an etching liquid TPE-3000 (tradename, manufactured by Toray Engineering Co., Ltd.) which had been stirred at 70° C. with a magnetic stirrer to such an extent that a whirlpool had been formed. At the time when the polyimide film had been fully removed in the form of the mask, the laminate was taken out of the etching liquid, and the dry film resist was separated with a 3 wt % aqueous NaOH solution at 50° C. at a spray pressure of 1 kg.

Figure 10:
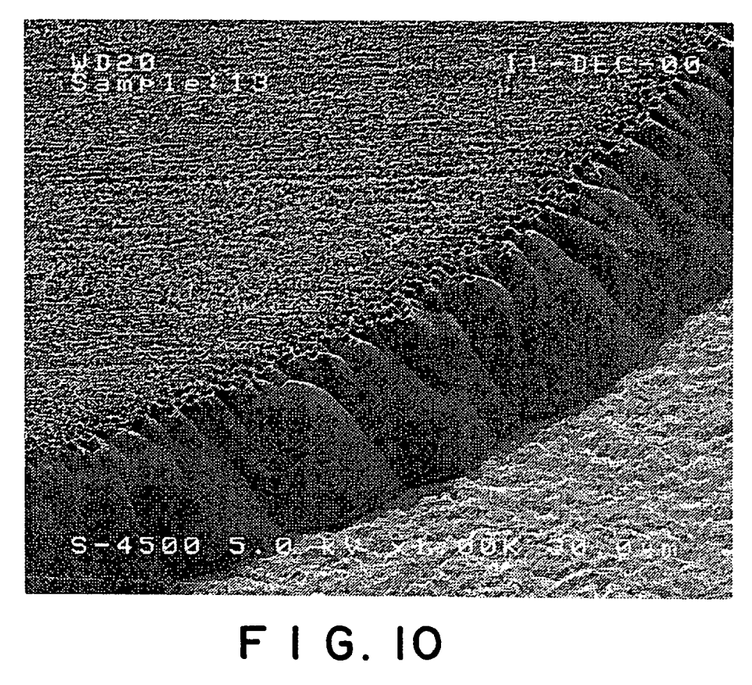
FIG. 10 is an SEM photograph (scanning electron photomicrograph) of sample A.

The insulating layer, which has been brought to a desired shape, was observed under SEM to inspect the etching shape. A scanning electron microphotograph of sample A at a magnification of 1,000 times is shown in FIG. 10. A scanning electron microphotograph of sample B at a magnification of 1,000 times is shown in FIG. 11.

Figure 11:
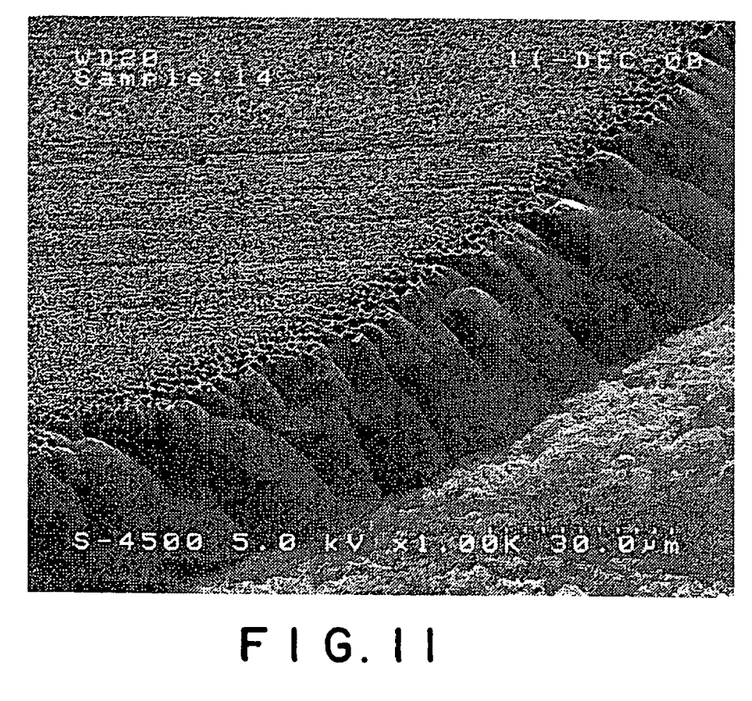
FIG. 11 is an SEM photograph (scanning electron photomicrograph) of sample B.

As can be seen from the scanning electron microphotographs shown in FIGS. 10 and 11, although the scanning electron microphotographs are not somewhat clear, for sample A, sites, where the roughened surface of the copper foil had extended through the adhesive layer, were observed, and this caused the end face to be projected in a ridge form in places. Further, the end face of the upper part of the insulating layer was serrate and was partially lost. This is possibly causative of contamination of the surface of the disk. On the other hand, for sample B, the influence of the roughened surface of the copper foil was small, the level of projection in a ridge form was also small, and the shape of the end face of the upper part was also smooth.

The above results show that a very good etching shape can be realized by rendering the thickness of the adhesive insulating layer larger than the average height of irregularities, of the roughened surface of the inorganic material layer, which would be transferred onto the adhesive insulating layer.

Evaluation of Dusting

Previously filtered distilled water (hereinafter referred to as "blank"), fully cleaned beakers, and tweezers were provided.

Each sample (four patterns) used in the evaluation of the pattern shape was placed in the beaker, and a given amount of the blank was poured into the beaker. The beaker was then placed within an ultrasonic irradiation system, and ultrasonic wave was applied for one min (extraction). After the application of ultrasonic wave, the beaker was taken out of the system, and the sample was taken out with the tweezers. After taking the sample out of the beaker, a given amount of the extract was set in a measuring apparatus equipped with an automatic fine particle measuring device for a liquid manufactured by HIAC/ROYCO, a suction-type semi-automatic sampling device, and a laser diode light blocking-type sensor to measure the amount of particles. To determine a blank value, the same measurement as described above was carried out except that the sample was not placed. The measuring apparatus was cleaned for each measurement. The blank value was subtracted from the measured value to determine the measured value of the sample. The measurement was carried out five times per sample, and the average of the five values was regarded as the final measured value. The results of the evaluation of samples A and B are shown in Table 1 below. The amount of particles in each sample column is the average of four patterns.

TABLE 1

| Particle diameter, μm | Sample A, number of particles | Sample B, number of particles |
| --- | --- | --- |
| 0.5 μm | 63127 | 30669 |
| 1.0 μm | 488 | 402 |
| 2.0 μm | 205 | 195 |
| 3.0 μm | 74 | 55 |
| 5.0 μm | 34 | 23 |
| 10.0 μm | 14 | 9 |
| 15.0 μm | 7 | 2 |
| 25.0 μm | 3 | 1 |

As is apparent from Table 1, as compared with sample A comprising a thermoplastic polyimide having a thickness equal to Rz=1.5 μm of the copper foil, sample B comprising a thermoplastic polyimide having a larger thickness had a lower level of dusting.

In the laminate and the insulating film according to the present invention, when the average height of irregularities of an insulating layer as a result of transfer of surface irregularities of an inorganic material onto the insulating layer in an insulating film is rendered smaller than the thickness of the outermost insulating unit layer in the insulating layer, the etching shape after wet etching of the laminate and the insulating film is good and a highly reliable electronic circuit component, particularly a suspension, which causes no significant dusting, can be prepared.

In particular, in the case of a suspension for a hard disk drive, the area of the insulating layer to be removed by etching is large and, at the same time, a fine pattern is required. Therefore, the effect attained by the application of the wet etching is large. The laminate and the insulating film according to the present invention have enhanced wet etching reliability and thus are suitable for suspensions for hard disk drives.

The invention claimed is:

1. A process for producing an electronic circuit component comprising the steps of:

providing a laminate having a layer construction of first conductive inorganic material layer-insulating layer-second conductive inorganic material layer or a layer construction of conductive inorganic material layer-insulating layer, the insulating layer comprising a laminate of two or more wet etchable insulating unit layers, at the interface between at least one of the conductive inorganic material layers and the insulating layer, surface irregularities of the conductive inorganic material layer having been transferred onto the surface of the insulating layer, the average height of the surface irregularities transferred onto the insulating layer being less than the thickness of the outermost insulating unit layer in the insulating layer, the average height of profile irregularities being expressed in terms of mean roughness Rz specified in JIS (Japanese Industrial Standards) C 6515, the thickness of the insulating unit layer being 1.1 to 3 times Rz; and wet etching the laminate to produce the electronic circuit component.

2. The process according to claim 1, wherein the mean roughness Rz of the surface of the inorganic material layer is 0.2 to 15 μm.

3. The process according to claim 1, wherein the insulating layer has a layer construction of adhesive insulating layer-core insulating layer-adhesive insulating layer.

4. The process according to claim 3, wherein, in the insulating layer having a layer construction of adhesive insulating layer-core insulating layer-adhesive insulating layer, the two adhesive insulating layers, which sandwich the core insulating layer therebetween, are each formed of a polyimide resin, and the polyimide resin constituting one of the adhesive insulating layers is identical to the polyimide resin constituting the other adhesive insulating layer in composition.

5. The process according to claim 3, wherein, in the insulating layer having a layer construction of adhesive insulating layer-core insulating layer-adhesive insulating layer, the two adhesive insulating layers, which sandwich the core insulating layer therebetween, are each formed of a polyimide resin, and the polyimide resin constituting one of the adhesive insulating layers is different from the polyimide resin constituting the other adhesive insulating layer in composition.

6. The process according to claim 1, wherein all the insulating unit layers constituting the insulating layer contain an organic material.

7. The process according to claim 1, wherein at least one of the insulating unit layers constituting the insulating layer is formed of an organic material with an inorganic material incorporated therein.

8. The process according to claim 1, wherein at least one of the insulating unit layers constituting the insulating layer has a coefficient of linear thermal expansion of not more than 30 ppm.

9. The process according to claim 1, wherein the difference in coefficient of linear thermal expansion between at least one of the insulating unit layers constituting the insulating layer and the inorganic material layer is not more than 15 ppm.

10. The process according to claim 1, wherein at least one of the insulating unit layers constituting the insulating layer is formed of a polyimide resin.

11. The process according to claim 1, wherein the insulating layer is etchable with an alkaline etching liquid having a pH value of 7 or greater.

12. The process according to claim 1, wherein the inorganic material constituting the inorganic material layer is selected from copper, alloy copper, stainless steel, surface treated copper, surface treated alloy copper, and surface treated stainless steel.

13. The process according to claim 1, wherein both the first inorganic material layer and the second inorganic material layer are formed of copper or surface treated copper.

14. The process according to claim 1, wherein both the first inorganic material layer and the second inorganic material layer are formed of alloy copper or surface treated alloy copper.

15. The process according to claim 1, wherein both the first inorganic material layer and the second inorganic material layer are formed of stainless steel or surface treated stainless steel.

16. The process according to claim 1, wherein any one of the first inorganic material layer and the second inorganic material layer is formed of stainless steel or surface treated stainless steel and the other inorganic material layer is formed of copper or surface treated copper.

17. The process according to claim 1, wherein any one of the first inorganic material layer and the second inorganic material layer is formed of stainless steel or surface treated stainless steel and the other inorganic material layer is formed of alloy copper or surface treated alloy copper.

* * * * *

UNITED STATES PATENT AND TRADEMARK OFFICE
CERTIFICATE OF CORRECTION

PATENT NO. : 8,066,891 B2  
APPLICATION NO. : 11/543812  
DATED : November 29, 2011  
INVENTOR(S) : Sakayori et al.

Page 1 of 1

It is certified that error appears in the above-identified patent and that said Letters Patent is hereby corrected as shown below:

Title Page

Please amend the Assignee information as follows:

Item (73), please change "Dai Nippon Printing Co., Ltd., Tokyo (JP)" to --Dai Nippon Printing Co., Ltd., Tokyo (JP); Nippon Steel Chemical Co., Ltd., Tokyo (JP)--.

Signed and Sealed this
Thirty-first Day of January, 2012

David J. Kappos
*Director of the United States Patent and Trademark Office*